United States Patent [19]
Kawano et al.

[11] Patent Number: 5,774,797
[45] Date of Patent: Jun. 30, 1998

[54] PORTABLE TELEPHONE

[75] Inventors: Osamu Kawano; Minoru Sakata, both of Kawasaki, Japan

[73] Assignee: Fujitsu Limited, Kanagawa, Japan

[21] Appl. No.: 532,275

[22] Filed: Sep. 22, 1995

[30] Foreign Application Priority Data

Jan. 23, 1995 [JP] Japan .................................. 7-007851

[51] Int. Cl.$^6$ ...................................................... H04B 1/04
[52] U.S. Cl. ......................... 455/127; 455/115; 455/117
[58] Field of Search ................................ 455/89, 90, 91, 455/95, 115, 116, 126, 127, 343, 572, 573, 574, 575, 67.1, 73; 330/129, 279, 289

[56] References Cited

U.S. PATENT DOCUMENTS

| | | | |
|---|---|---|---|
| 4,989,260 | 1/1991 | Meade | 455/127 |
| 5,081,713 | 1/1992 | Miyazaki | 455/115 |
| 5,192,919 | 3/1993 | Wieczorek | 455/127 |
| 5,239,694 | 8/1993 | Toyoshima | 455/127 |

*Primary Examiner*—Reinhard J. Eisenzopf
*Assistant Examiner*—Thanh Le
*Attorney, Agent, or Firm*—Helfgott & Karas, PC.

[57] ABSTRACT

The present invention discloses a portable telephone which is free from overheat of power amplifier module and also capable of a stable transmission even in the condition that it is unable to amplify the power enough. The portable telephone incorporates a power amplifier module which contains power FET's for amplifying transmission signals. A supply voltage monitoring means detects a supply voltage of a power supply. A control-voltage setting table stores a plurality of commands to set a control-voltage of the power amplifier module. A control-voltage selecting means selects a relevant command out of the control-voltage setting table with reference to the detected supply voltage. A control-voltage control means controls the control-voltage of the power amplifier module according to the command selected by the control-voltage selecting means. The control-voltage will be thereby reduced when the supply voltage is high. This results in reduction of a current flow in the power amplifier module, and an overheat of the power amplifier module can be avoided.

24 Claims, 19 Drawing Sheets

| NAME | VALUE |
|---|---|
| VGTH1 | 4.5 V |
| VGTH2 | 5.0 V |
| VGTH3 | 5.5 V |
| VGTH4 | 6.0 V |
| VGTH5 | 6.5 V |

FIG. 8

| NAME | MEASURED SUPPLY VOLTAGE | COMPENSATION VALUE |
|---|---|---|
| $\Delta VG1$ | $VGTH1 < V_x \leq VGTH2$ | 0.05 V |
| $\Delta VG2$ | $VGTH2 < V_x \leq VGTH3$ | 0.10 V |
| $\Delta VG3$ | $VGTH3 < V_x \leq VGTH4$ | 0.15 V |
| $\Delta VG4$ | $VGTH4 < V_x \leq VGTH5$ | 0.20 V |
| $\Delta VG5$ | $VGTH5 < V_x$ | 0.25 V |

FIG. 9

| NAME | VALUE |
|---|---|
| TMPTH1 | 60° C |
| TMPTH2 | 70° C |
| TMPTH3 | 80° C |
| TMPTH4 | 90° C |
| TMPTH5 | 100° C |

FIG. 11

| NAME | MEASURED INTERNAL TEMPERATURE | COMPENSATION VALUE |
|---|---|---|
| $\Delta VG11$ | $TMPTH1 < T_x \leq TMPTH2$ | 0.05 V |
| $\Delta VG12$ | $TMPTH2 < T_x \leq TMPTH3$ | 0.10 V |
| $\Delta VG13$ | $TMPTH3 < T_x \leq TMPTH4$ | 0.15 V |
| $\Delta VG14$ | $TMPTH4 < T_x \leq TMPTH5$ | 0.20 V |
| $\Delta VG15$ | $TMPTH5 < T_x$ | 0.25 V |

FIG. 12

| NAME | VALUE |
|---|---|
| TMPTH11 | 70° C |
| VDTH11 | 3.4 V |
| VDTH12 | 3.2 V |
| VDTH13 | 3.1 V |

FIG. 16

| NAME | MEASURED VALUE | COMPENSATION VALUE |
|---|---|---|
| $\Delta PWR(TMP)$ | $T_Y \leq TMPTH1$ | 1. 0 dB |
| $\Delta PWR(VDTH11)$ | $VDTH12 < V_Y \leq VDTH11$ | 0. 5 dB |
| $\Delta PWR(VDTH12)$ | $VDTH13 < V_Y \leq VDTH12$ | 1. 0 dB |
| $\Delta PWR(VDTH13)$ | $V_Y \leq VDTH13$ | 1. 5 dB |

FIG. 17

PORTABLE TELEPHONE

BACKGROUND OF THE INVENTION

1. Field of the Invention

The present invention relates to a portable telephone, and more specifically, to a portable telephone operable at a lower supply voltage.

2. Description of the Related Art

Portable telephones have become smaller and lighter in virtue of advancement of semiconductor technologies. This success in miniaturization and weight reduction has resulted in increased utility and convenience of the portable telephones.

FIG. 19 is a block diagram schematically showing a structure of a conventional portable telephone. The portable telephone shown in FIG. 19 consists of two main units, a control unit and a radio unit.

A main control unit 506 is the prime constituent of the control unit, which links to a display/operation unit 503, a microphone/speaker unit 501, a speech processing circuit 504, a TDMA circuit 505, and a system power supply unit 600. The main control unit 506 receives signals from those peripheral units and controls the total system of the portable telephone by signal data processing.

The microphone/speaker unit 501 is connected to the speech processing circuit 504 which encodes and decodes speech signals. The speech processing circuit 504 links to the TDMA (Time Division Multiple Access) circuit 505 and they exchange encoded data with each other. The TDMA circuit 505 controls data transfer based on the TDMA communications technique. The display/operation unit 503 supports data inputs from users and also displays various messages on its display screen.

The system power supply unit 600, which provides the portable telephone with an operating power, comprises a supply voltage monitor 610 and a temperature monitor 620. The supply voltage monitor 610 monitors the supply voltage level and the temperature monitor 620 monitors the internal temperature of the portable telephone. The system power supply unit 600 is controlled by signals from the TDMA circuit 505 and the main control unit 506.

In the radio unit, an antenna 401 is connected to a coupler 402, which couples a receive band-pass filter 403 and a transmission band-pass filter 418. Receiving the radio signals from the antenna 401, the receive band-pass filter 403 selectively passes only necessary signals through to a receiver unit 404. The receiver unit 404 amplifies the received signals and send them to the TDMA circuit 505.

On the other hand, the TDMA circuit 505 outputs a transmission signal to a transmission signal processing circuit 411. After shaping its waveform, the transmission signal processing circuit 411 sends the signal to an orthogonal modulator 412. The signal modulates a carrier and this modulated transmission signal is sent to a transmitter unit 430.

A variable gain amplifier 431 in the transmitter unit 430 amplifies the transmission signal and forwards it to a Power Amplifier module (a PA module, hereafter) 432.

The PA module 432 is a high-efficiency power amplifier using GaAsFET's (Gallium Arsenide Field Effect Transistors) or MMIC's (Monolithic Microwave Integrated Circuits) developed for power amplification. The PA module 432 is supplied with a power to a drain voltage terminal VD through a switch circuit to turn on or off the power. A negative-voltage generator 420, which is controlled by the TDMA circuit 505, provides the PA module 432 with a gate voltage VG. The signal amplified by the PA module 432 is fed to the antenna 401 via the transmission band-pass filter 418.

A PLL (Phase-Locked Loop) synthesizer circuit 415, coupled to the TDMA circuit 505, sends its output to the receiver unit 404 and an orthogonal modulator 412 for instant switching of the channels in response to the request from the TDMA circuit 505.

An envelope detector unit 417 demodulates the transmission signal by a diode detector circuit and sends the detected envelope signal to an APC (Automatic Power Control) unit 440. The APC unit 440, coupled to the TDMA circuit 505, thereby recognizes the current transmission power level. If there is any deviation from a set value of the transmission power, the APC unit 440 will regulate it by adjusting the gain of a variable gain amplifier 431.

In the above-described hardware of a portable telephone, a transmission operation is performed in the following way.

An analog speech signal from the microphone/speaker unit 501 is converted into digital data in the speech processing circuit 504, and the TDMA circuit 505 outputs the digital speech data in a time slot in accordance with the TDMA system.

The output signal of the TDMA circuit 505 is then filtered in the transmission signal processing circuit 411 so that the signal will be limited within a standard band width, and modulates a carrier in the orthogonal modulator 412. The PLL synthesizer circuit 415 supports a high-speed channel switching control in the orthogonal modulator 412.

The transmission signal, now being a modulated carrier wave signal, is amplified by the variable gain amplifier 431 and PA module 432 up to a predetermined level, passes through the transmission band-pass filter 418, and is radiated out into space from the antenna 401. The transmission power is controlled within a range of 0 dB to −20 dB in a stepwise manner of 4 dB in reference with 0.8 W, which is determined by the main control unit 506 interpreting a command from a communications base station.

The envelope detector unit 417 demodulates the transmission power signal and the average envelope level, which indicates the measured transmission power strength, is sent to the APC unit 440. The APC unit 440 compares it to the set value and thereby controls the variable gain amplifier 431 so as to provide a well-regulated transmission power.

The radio wave signal received at the antenna 401 is filtered by the receive band-pass filter 403 and only the signals within a necessary frequency range are inputted to the receiver unit 404. The receiver unit 404 converts the received signals down to lower frequency signals and amplifies them for use in the TDMA circuit 505. Here, the receiver unit 404 can switch the channels under control of the PLL synthesizer circuit 415.

The TDMA circuit 505 analyzes the received signal and outputs a digital signal to the speech processing circuit 504. The speech processing circuit 504 converts the signal to an analog speech signal and sends it to the microphone/speaker unit 501 for audio output.

Many of the conventional portable telephones as explained above operate at the supply voltage of 6.0 V, which is comparatively high. A gate voltage for the PA module in such portable telephones is fixed or set to a value determined by a transmission power level.

On the other hand, continuing demands for further downsizing of the portable telephones requests that the power supply voltage be lower than ever. This is due to the nature of batteries used in the portable telephones. Since it is impossible to increase the output voltage of a battery cell, the operating voltage of the portable telephones should be lowered in order to reduce the battery cells for downsizing. Therefore, some recent portable telephones can operate at 4.8 V or less, and furthermore, ones operable at 3.6 V are now in demand. The types of battery suitable to portable telephones are nickel-cadmium (NiCd), lithium ion, and nickel-metal-hydride (NiMH).

Although reduction of the supply voltage is needed, the transmission power should be maintained at the determined level. When the supply voltage is reduced, the current flow in the PA module increases inversely with the supply voltage and it causes an increase in power dissipation thereof. The PA module, which amplifies the power of transmission signal, should be used within the absolute maximum rating of operating case temperature and its use at a temperature higher than the rating could result in a thermal failure.

That is, when operating at a lower supply voltage, the PA module is likely to heat up. Under such conditions, the internal temperature of the PA module could reach the absolute maximum rating by some reasons for heating up.

For example, using the portable telephone with a battery charger connected thereto could overheat the PA module, for the supply voltage is as high as 6 V. As the 6 V power supply is applied to such a circuit that is designed for normal operation at 3.6 volts, a larger current will flow in the PA module, thus causing a high temperature. Dry batteries, if used in a portable telephone, will also produce a high voltage at the beginning of operations.

Another problem with the lower supply voltage is that the PA module cannot provide enough amplitude at a high temperature.

The transmission power, as mentioned before, is controlled by the APC unit so that it will be well regulated to the commanded power level. Actually, however, it works as above only when the transmitter unit has enough operating margin with its power stage. If the power amplifying stage of the transmitter unit (e.g. the PA module) has heated up and cannot amplify the signal enough, the transmission power will become unstable because it is out of the regulation capability that the APC unit can offer.

As described above, in a conventional portable telephone, the current in the PA module must increase in order to reduce the supply voltage. It results in heating up of the PA module and thereby causing an instability of operations of the transmitter unit.

SUMMARY OF THE INVENTION

Taking the above into consideration, an object of the present invention is to provide a portable telephone operable at a low voltage, wherein a power amplifier module is free from overheat.

Another object of the present invention is to provide a portable telephone operable at a low voltage, wherein a stable transmission can be performed even though a power amplifier module is unable to provide enough amplification performance due to a high temperature.

To accomplish the above objects, according to the present invention, there is provided a portable telephone which includes a power amplifier module to amplify a transmission signal. The portable telephone comprises supply voltage monitoring means for detecting a supply voltage of a power supply. It also comprises a control-voltage setting table and control-voltage selecting means. In the control-voltage setting table, control-voltage setting commands are registered for specifying a control-voltage of the power amplifier module according to the supply voltage. The control-voltage selecting means selects the control-voltage setting command out of the control-voltage setting table, which is associated with the supply voltage detected by the supply voltage monitoring means. Control-voltage generating means, also incorporated in the portable telephone, generates the control-voltage of the power amplifier module according to the control-voltage setting command selected by the control-voltage selecting means.

There is also provided another portable telephone capable of outputting transmission signals at an arbitrary power level. The portable telephone comprises supply voltage monitoring means for detecting a supply voltage of a power supply. It also comprises a transmission power setting table and transmission power selecting means. The transmission power setting table is used for registering transmission power setting commands which specify a transmission power according to the supply voltage. The transmission power selecting means selects the transmission power setting command out of the transmission power setting table, which is associated with the supply voltage detected by the supply voltage monitoring means. Transmission power control means is another integral part of the portable telephone for controlling the transmission power according to the transmission power setting command selected by the transmission power selecting means.

The above and other objects, features and advantages of the present invention will become apparent from the following description when taken in conjunction with the accompanying drawings which illustrate a preferred embodiment of the present invention by way of example.

BRIEF DESCRIPTION OF THE DRAWINGS

FIG. 8 illustrates a threshold setting table for storing thresholds with respect to a supply voltage;

FIG. 9 shows a gate voltage setting table for specifying compensation values to control a gate voltage with respect to a supply voltage;

FIG. 11 shows a threshold setting table for storing thresholds with respect to an internal temperature;

FIG. 12 shows a gate voltage setting table for setting a gate voltage with respect to an internal temperature;

FIG. 16 exemplifies a threshold setting table for storing thresholds with respect to a supply voltage and an internal temperature for controlling a transmission power;

FIG. 17 shows a transmission power setting table;

DESCRIPTION OF THE PREFERRED EMBODIMENT

An embodiment of the present invention will be described below with reference to the drawings.

Figure 1:
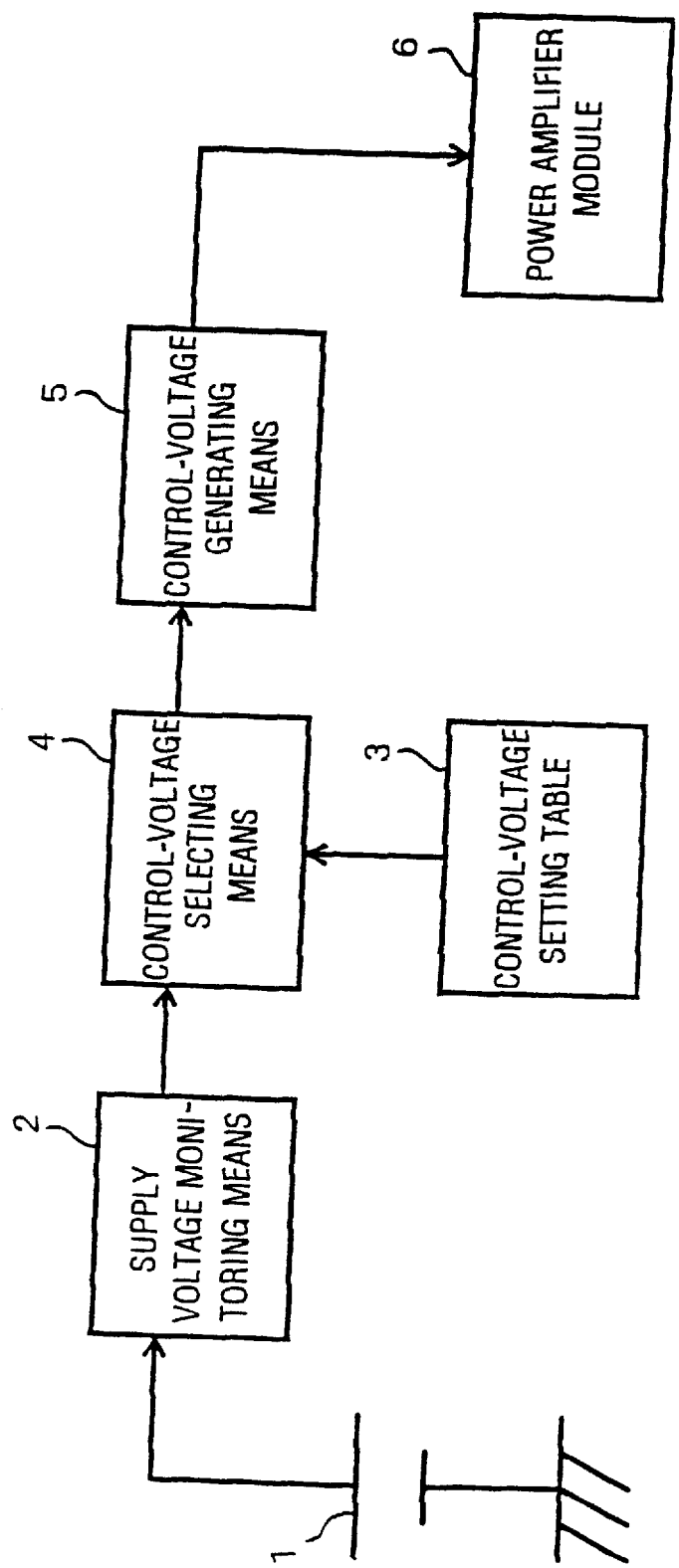
FIG. 1 is a conceptual view showing a structure of a portable telephone in accordance with the present invention, wherein a gate voltage (VG) of a power amplifier module is controlled.

FIG. 1 is a conceptual view showing a basic structure of a portable telephone in accordance with the present invention, wherein a gate voltage of a power amplifier module is controlled.

The portable telephone of the present invention incorporates a power amplifier module 6, which contains field effect transistors, for amplifying transmission signals. It also incorporates a supply voltage monitoring means 2 to detect the output voltage of a power supply 1. A gate voltage setting table 3 stores gate voltage setting commands to set the gate voltage of the power amplifier module 6 according to the supply voltage. A gate voltage selecting means 4 selects a gate voltage setting command out of the gate voltage setting table 3, which is associated with the detected supply voltage. A gate voltage generating means 5 generating the gate voltage of the power amplifier module 6 according to the selected gate voltage setting command.

By those means, when the output voltage of the power supply 1 is high, the current in the power amplifier module 6 is reduced by increasing the absolute gate voltage thereof. As a result, the power amplifier module 6 becomes free from overheat.

In general, the power amplifier module 6 is a high-efficiency power amplifier using GaAsFET and the output voltage of the power supply 1 is supplied to the GaAsFET as a drain voltage VD via a switch circuit to turn on and off transmission. An idle current of the power amplifier module can be controlled by changing its gate voltage.

Figure 2:
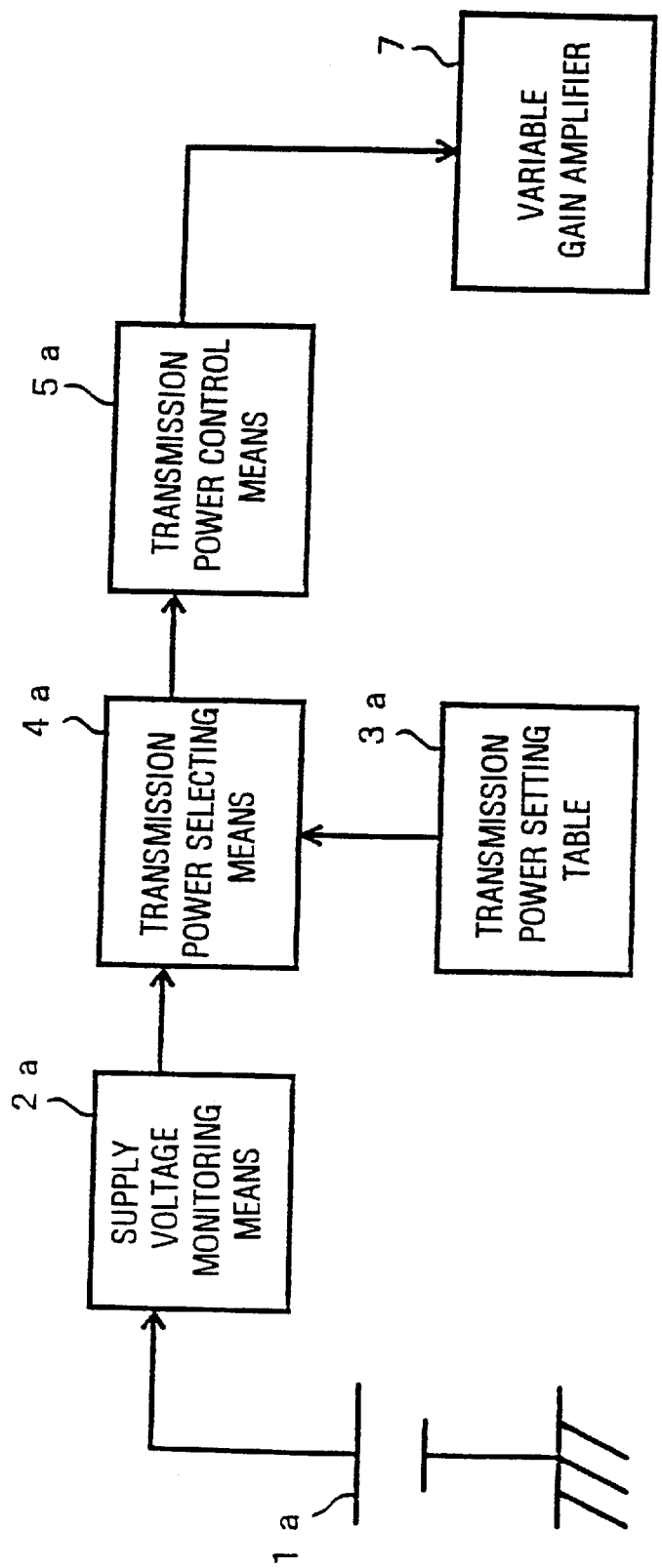
FIG. 2 is a conceptual view showing a structure of a portable telephone in accordance with the present invention, wherein a transmission power is controlled.

FIG. 2 is a conceptual view showing a structure of a portable telephone in accordance with the present invention, wherein a transmission power is controlled.

The portable telephone comprises the following means to output a transmission signal at an arbitrary power level. It incorporates a supply voltage monitoring means 2a to detect the output voltage of a power supply 1a. A transmission power setting table 3a stores transmission power setting commands to set the transmission power according to the supply voltage (i.e., the output voltage of the power supply 1a). Transmission power selecting means 4a selects a transmission power setting command, which is associated with the detected supply voltage, out of the transmission power setting table 3a. Transmission power control means 5a controls the transmission power by adjusting a control voltage of a variable gain amplifier 7 according to the transmission power setting command selected by the transmission power selecting means 4a.

By those means, when the power amplifier module is at a high temperature and unable to provide enough amplification performance, a transmission power setting command for lowering the power is selected. The portable telephone therefore can continue a stable transmission at a lower power level within a range that the standard allows.

Figure 3:
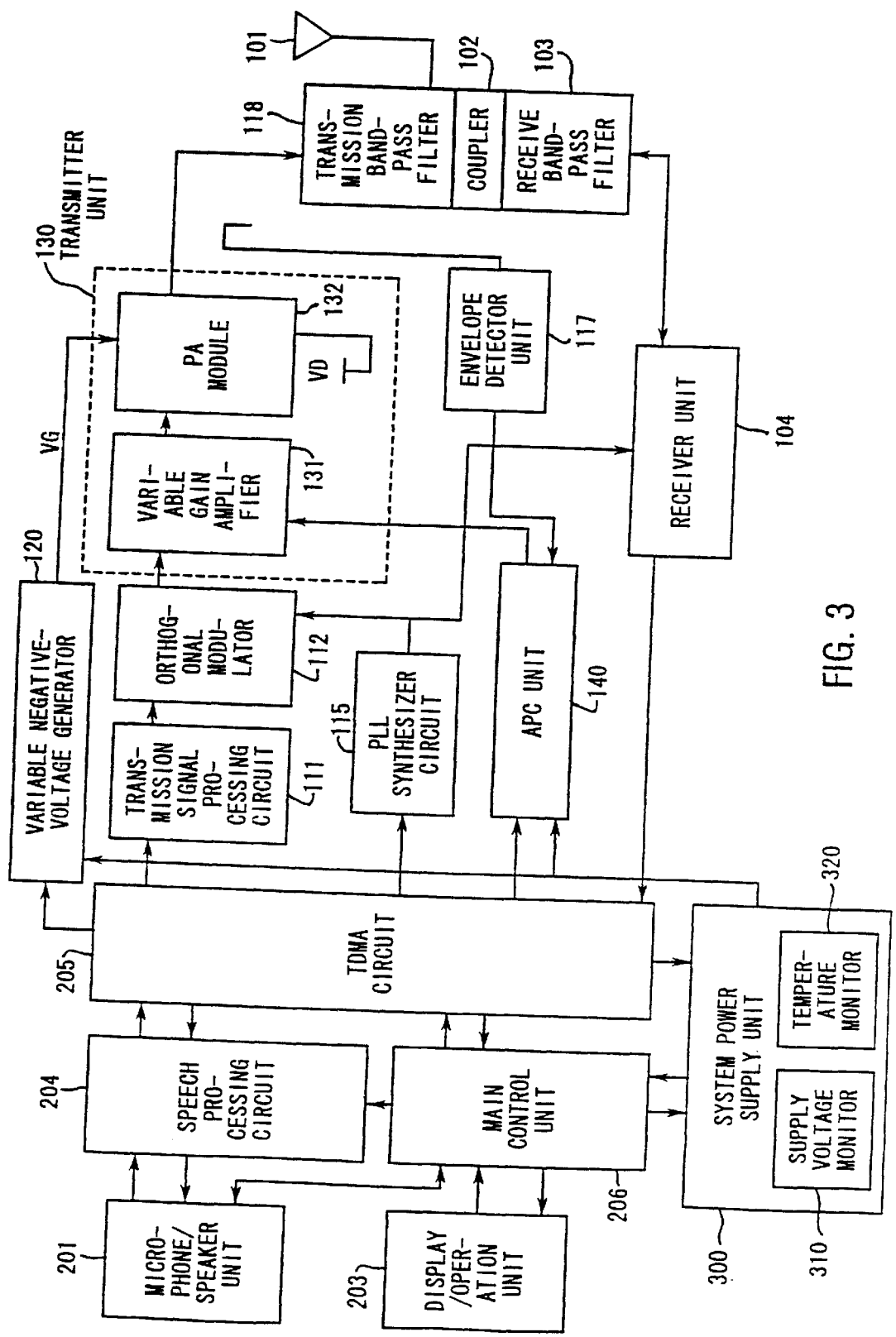
FIG. 3 is a block diagram schematically showing a hardware for a portable telephone in accordance with the present invention.

FIG. 3 is a block diagram schematically showing a hardware for a portable telephone in accordance with the present invention. The portable telephone incorporates two control features based on measurement of a power supply voltage and an internal temperature, which simultaneously control a gate voltage of the power amplifier module and a transmission power. The hardware of the portable telephone shown in FIG. 3 is roughly divided into two parts, a radio unit and a control unit.

A main control unit 206 is the prime constituent of the control unit, which links to a display/operation unit 203, a microphone/speaker unit 201, a speech processing circuit 204, a TDMA (Time Division Multiple Access) circuit 205, and a system power supply unit 300. The main control unit 206 receives signals from those peripheral units and controls the total system of the portable telephone by signal data processing.

The microphone/speaker unit 201 is connected to the speech processing circuit 204 which encodes and decodes the speech signals. The speech processing circuit 204 links to the TDMA circuit 205 and they exchange encoded data with each other. The TDMA circuit 205 controls data transfer based on the TDMA communications technique. The display/operation unit 203 receives data inputs from users and displays various messages on its display screen.

The system power supply unit 300, which provides the portable telephone with an operating power, comprises a supply voltage monitor 310 and a temperature monitor 320. The supply voltage monitor 310 monitors the supply voltage level and the temperature monitor 320 monitors the internal temperature of the portable telephone. The system power supply unit 300 is controlled by signals from the TDMA circuit 205 and the main control unit 206.

The supply voltage monitor 310 issues a gate voltage setting command and a transmission power setting command, which are both associated with the supply voltage. In contrast to the temperature-associated commands to be described later, the former and the latter will be called a "supply-associated gate voltage command" and a "supply-associated power command," respectively.

In the same way, the temperature monitor 320 issues another set of a gate voltage setting command and a transmission power setting command, which are both associated with the internal temperature. In contrast to previously described supply-associated commands, the former and the latter will be called a "temperature-associated gate voltage command" and a "temperature-associated power command," respectively.

The final gate voltage setting command will be calculated from the two gate voltage setting commands (i.e., one is supply-associated and the other is temperature-associated) and sent to a variable negative-voltage generator 120. The final transmission power setting command will be also calculated from the two transmission power setting commands (i.e., one is supply-associated and the other is temperature-associated) and sent to an APC unit 140.

In the radio unit, an antenna 101 is connected to a coupler 102, which couples a receive band-pass filter 103 and a transmission band-pass filter 118. On reception of the radio signals from the antenna 101, the receive bandpass filter 103 selectively passes only necessary signals through to a receiver unit 104. The receiver unit 104 amplifies the received signals and send them to the TDMA circuit 205.

On the other hand, the output signal from the TDMA circuit 205 is inputted to a transmission signal processing circuit 111. After shaping the waveform, the transmission signal processing circuit 111 sends the signal to an orthogonal modulator 112. The orthogonal modulator 112 modulates the carrier with the transmission signal and sends an RF (radio frequency) transmission signal to a transmitter unit 130.

A variable gain amplifier 131 in the transmitter unit 130 amplifies the RF transmission signal according to a control signal from the APC unit 140 and forwards it to a power amplifier module (a PA module) 132.

The PA module 132 is a high-efficiency power amplifier using GaAsFET's (Gallium Arsenide Field Effect Transistors) or MMIC's (Monolithic Microwave Integrated Circuits) developed for power amplification. The PA module 132 is supplied with a power to its drain voltage terminal VD through a switch circuit to turn on or off the transmission power. A variable negative-voltage generator 120, under the control of the TDMA circuit 205 as well as the system power supply unit 300, provides the PA module 132 with a gate voltage VG. The signal amplified by the PA module 132 is fed to the antenna 101 via the transmission band-pass filter 118.

A PLL (Phase-Locked Loop) synthesizer circuit 115, which is connected to the TDMA circuit 205, sends its output to the receiver unit 104 and orthogonal modulator 112. The PLL synthesizer circuit 115 instantly switches the channels in response to the request from the TDMA circuit 205.

An envelope detector unit 117 demodulates the RF transmission signal by a diode and sends the detected envelope signal to an APC (Automatic Power Control) control unit 140. The APC unit 140, coupled to the TDMA circuit 205, thereby keeps track of the current transmission power level. If there is any deviation from a set level of the transmission power, the APC unit 140 will try to regulate it by adjusting the gain of a variable gain amplifier 131. In addition, the APC unit 140 changes the transmission power setting in response to a request from the system power supply unit 300.

In the above-described hardware of a portable telephone, a transmission operation is performed in the following manner.

First, an analog speech signal from the microphone/speaker unit 201 is converted into digital data in the speech processing circuit 204, and the TDMA circuit 205 outputs the digital speech data in a time slot in accordance with the TDMA system.

The output signal of the TDMA circuit 205 is then filtered in the transmission signal processing circuit 111 so that the signal will conform to the standard band width, and it modulates a carrier in the orthogonal modulator 112. The PLL synthesizer circuit 115 controls a high-speed channel switching in the orthogonal modulator 112.

The radio frequency transmission signal (i.e., the modulated carrier wave) is amplified by the variable gain amplifier 131 and the PA module 132 up to a predetermined level. The transmission power level should be controlled within a range of 0 dB to −20 dB in a stepwise manner of 4 dB in reference with 0.8 W. The main control unit 206 determines the level by interpreting a command from a communications base station. The variable negative-voltage generator 120 provides the PA module 132 with a gate voltage VG which is derived from the measured supply voltage and internal temperature.

The envelope detector unit 117 demodulates the transmission power signal with a diode detector and sends the obtained envelope signal to the APC (Automatic Power Control) unit 140, thus indicating the measured transmission power level. The APC unit 140 compares it to the power level set by the TDMA circuit 205 and, if it is deviated, adjusts the variable gain amplifier 131 so as to provide the well-regulated transmission power. The power level is previously set in accordance with the supply voltage and internal temperature.

The radio wave signal received at the antenna 101 is filtered by the receive band-pass filter 103 and only the signals within a necessary frequency range are inputted to the receiver unit 104. The receiver unit 104 converts the received signal into lower frequencies and amplifies it for use in the TDMA circuit 205. The receiver unit 104 can switch the channels under control of the PLL synthesizer circuit 115.

The TDMA circuit 205 analyzes the received signal and outputs a digital signal to the speech processing circuit 204 for converting it to an analog speech signal. The analog speech signal is then sent to the microphone/speaker unit 201 for audio output.

Figure 4:
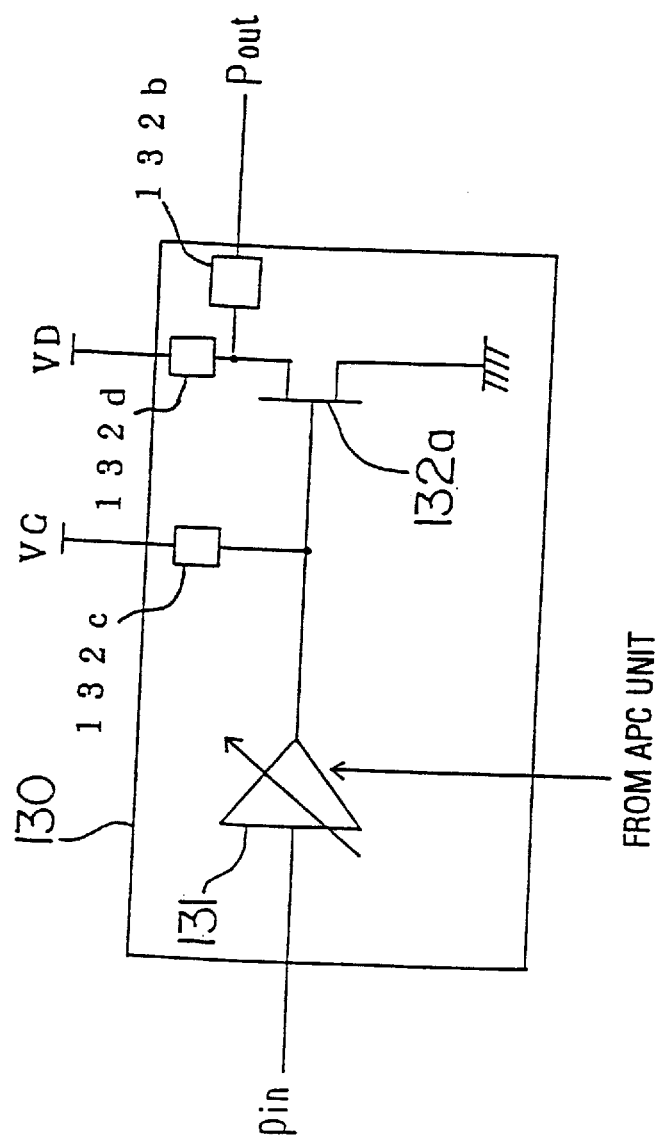
FIG. 4 is a circuit diagram of a transmitter unit.

FIG. 4 is a circuit diagram of the transmitter unit. A transmission signal Pin of the transmitter unit 130 is inputted to a variable gain amplifier 131. The output of the APC unit is connected to the gain control input of the variable gain amplifier 131. The variable gain amplifier 131 drives a gate input of a GaAsFET 132a, which is also biased by a voltage VG via a matching circuit 132c. The VG is a negative voltage provided by a variable negative-voltage generator. The drain terminal is connected via the matching circuit 132d to the drain voltage VD that may be turned on and off by a switch circuit (not shown). The output Pout of the transmitter unit is obtained from the drain through a matching circuit 132b. The source terminal of the GaAs FET 132a is grounded.

The transmission signal Pin is first amplified by the variable gain amplifier 131 according to a command from the APC unit. The transmission signal Pout having a desired power level is obtained by further amplification in the GaAsFET 132a, whose drain current is controlled by an absolute value of the gate voltage.

Next explanation will clarify in detail how to control the gate voltage of the PA module in above-described portable telephone.

Figure 5:
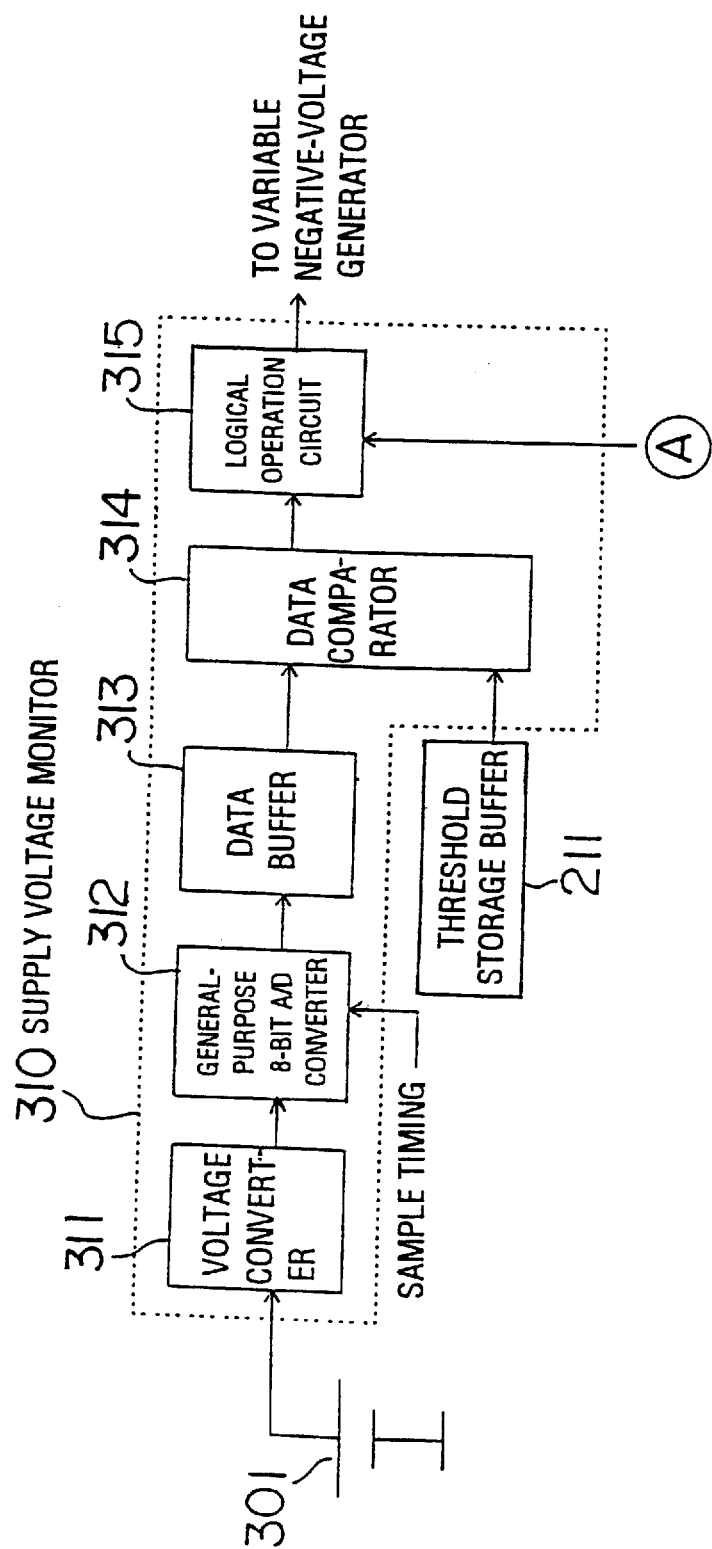
FIG. 5 is a block diagram showing an internal structure of a supply voltage monitor for controlling a gate voltage.

FIG. 5 is a block diagram showing an internal structure of a supply voltage monitor specifically for controlling a gate voltage. A voltage converter 311 in the supply voltage monitor 310 reduces the voltage of a power supply 301 down to a low voltage suitable for measurement by an internal circuit. This reduced voltage is sent to a general-purpose 8-bit A/D converter 312.

A sample timing signal, which is generated in correspondence with transmission timings, triggers the A/D converter 312 to start conversion of its analog input voltage to digital data. The measured and converted supply voltage will be saved into a data buffer 313 in digital form.

A threshold storage buffer 211 stores a table of thresholds to determine a gate voltage for the PA module in reference with the measured supply voltage. Those thresholds actually divide an overall voltage range into a plurality of small ranges. A data comparator 314 compares the data in the data buffer 313 with the thresholds in the threshold storage buffer 211, and determines the voltage range which includes the measured supply voltage. The data comparator 314 then outputs a supply-associated gate voltage command corresponding to the voltage range determined by looking up in a gate voltage setting table.

Note that supply-associated gate voltage commands for a supply voltage below a predetermined level will designate the same gate voltage as the standard gate voltage. In other words, there is no need to compensate the gate voltage as long as the supply voltage is within a normal range.

The supply-associated gate voltage command outputted from the data comparator 314 goes to a logical operation circuit 315, which also receives a temperature-associated gate voltage command from the temperature monitor. From those two commands, the logical operation circuit 315 calculates a gate voltage setting command to be finally supplied to the variable negative-voltage generator 120.

Figure 6:
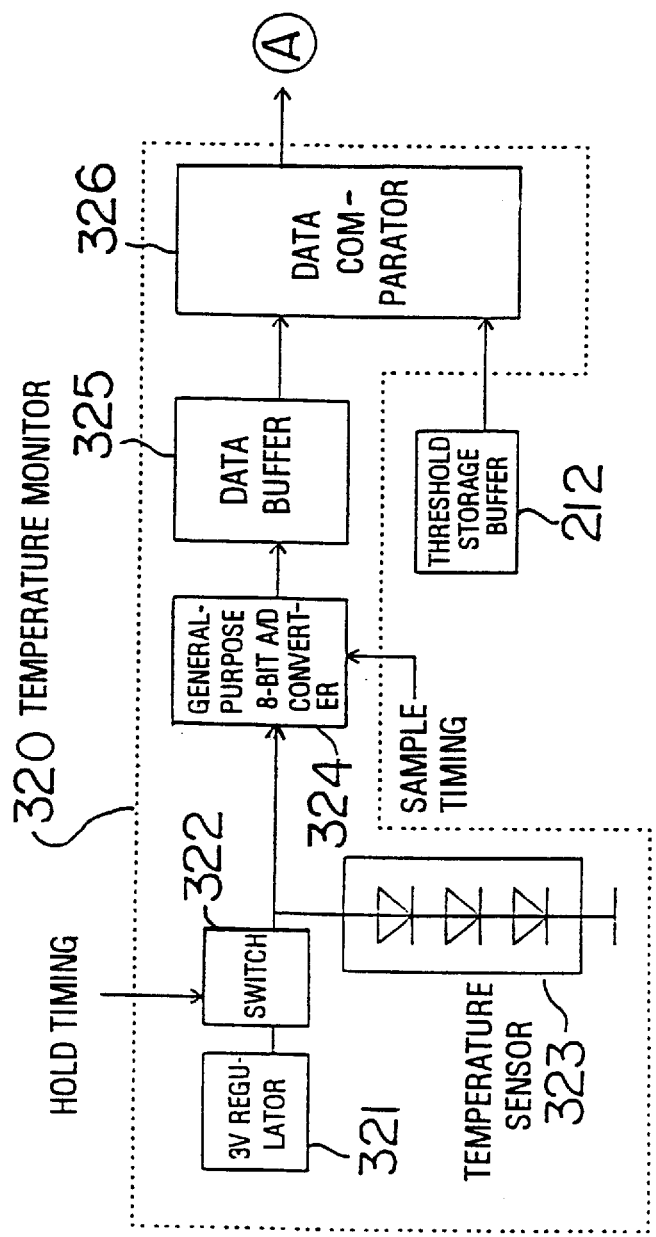
FIG. 6 is a block diagram showing an internal structure of a temperature monitor for controlling a gate voltage.

FIG. 6 is a block diagram showing an internal structure of a temperature monitor specifically for controlling a gate voltage. In a temperature monitor 320, a 3 V regulator 321 supplies a current to a temperature sensor 323 via a switch 322 and a temperature sensor 323 is wired to a general-purpose 8-bit A/D converter 324. The switch 322 is controlled by a hold timing signal input so that the temperature sensing operation will be done while the hold timing signal is active. The temperature sensor 323 is organized by some diodes connected in series and measures the internal temperature by sensing a change of the diodes' forward voltage drop, which is a function of junction temperature.

The general-purpose 8-bit A/D converter 324 is controlled by a sample timing signal input so that an analog temperature signal will be converted to digital data when the sample timing signal is activated. The digital temperature data from the general-purpose 8-bit A/D converter 324 is then stored in a data buffer 325.

A threshold storage buffer 212 stores a table of thresholds to be used to determine a gate voltage of the PA module in reference with the measured temperature. Those thresholds actually divide a total temperature range into a plurality of small ranges. A data comparator 326 compares the data in the data buffer 325 with the thresholds in the threshold storage buffer 212, and determines the temperature range which includes the measured temperature. The data comparator 326 then outputs a temperature-associated gate voltage command corresponding to the temperature range determined by looking up in a gate voltage setting table.

Note that temperature-associated gate voltage commands for temperature below a predetermined level are the same as the standard gate voltage. In other words, no compensation for the gate voltage is necessary as long as the temperature is within a normal range.

The temperature-associated gate voltage command outputted from the data comparator 326 goes to a logical operation circuit 315 shown in FIG. 5.

In the structure shown in FIGS. 5 and 6, the hold timing signal for the temperature monitor 320 is generated during the transmission timing of the portable telephone. The temperature value to be measured is thereby held on. Consecutively generated is the sample timing signal, which is inputted to the general-purpose 8-bit A/D converter 312 in the supply voltage monitor 310 as well as to the general-purpose 8-bit A/D converter 324 in the temperature monitor 320. The object of outputting the hold timing signal and the sample timing signal during the transmission time is to measure the supply voltage and internal temperature while the PA module is amplifying a transmission signal. Actually, however, the temperature sampling may be done at any time during a call, not necessarily in the middle of the amplification.

At the supply voltage monitor 310 in FIG. 5, the supply voltage is converted to an 8-bit digital data by the general-purpose 8-bit A/D converter 312 in response to the sample timing signal, and stored into the data buffer 313. The data comparator 314 compares the digital data of the supply voltage with the data in the threshold storage buffer 211 and thereby generates the supply-associated gate voltage command.

Similarly, at the temperature monitor 320 in FIG. 6, the internal temperature is converted to an 8-bit digital data by the general-purpose 8-bit A/D converter 324 in response to the sample timing signal, and stored into the data buffer 325. The data comparator 326 compares the digital data of the internal temperature with the data in the threshold storage buffer 212 and thereby generates the temperature-associated gate voltage command.

The generated supply-associated and temperature-associated gate voltage commands are analyzed in the logical operation circuit 315 shown in FIG. 5, and a gate voltage setting command is synthesized for use in the variable negative-voltage generator. The logical operation taken in this procedure can be either an OR-type or AND-type negotiation.

In the case of taking an OR-type operation, the gate voltage setting command will be obtained so that it will compensate a standard gate voltage with a sum of compensational factors involved in the supply-associated gate voltage command and the temperature-associated gate voltage command. The gate voltage setting command thereby obtained will be sent to the variable negative-voltage generator. That is, if either the supply-associated or the temperature-associated gate voltage command shows difference from the standard gate voltage, the different one will be the gate voltage setting command. If both of them are different from the standard gate voltage, the sum of their differences will compensate the standard gate voltage.

On the other hand, in the case of taking an AND-type operation, only when the two gate voltage commands are both different from the standard gate voltage, the gate voltage will be changed. That is, the gate voltage setting command is obtained so that it will compensate the standard gate voltage with a sum of compensational factors involved in both the supply-associated gate voltage command and the temperature-associated gate voltage command, and sent to the variable negative-voltage generator. If only one is different and the other is the same, the gate voltage setting command will designate the standard gate voltage.

Regarding the data comparator 326, it is possible to take other configurations. For example, the temperature-associated gate voltage command can be set as a multiplier to the supply-associated gate voltage command. That is, a gate voltage setting command is calculated from the supply-associated gate voltage command multiplied by the temperature-associated gate voltage command. Another possible approach is that the supply-associated gate voltage command is defined as a multiplier to the temperature-associated gate voltage command.

Figure 7:
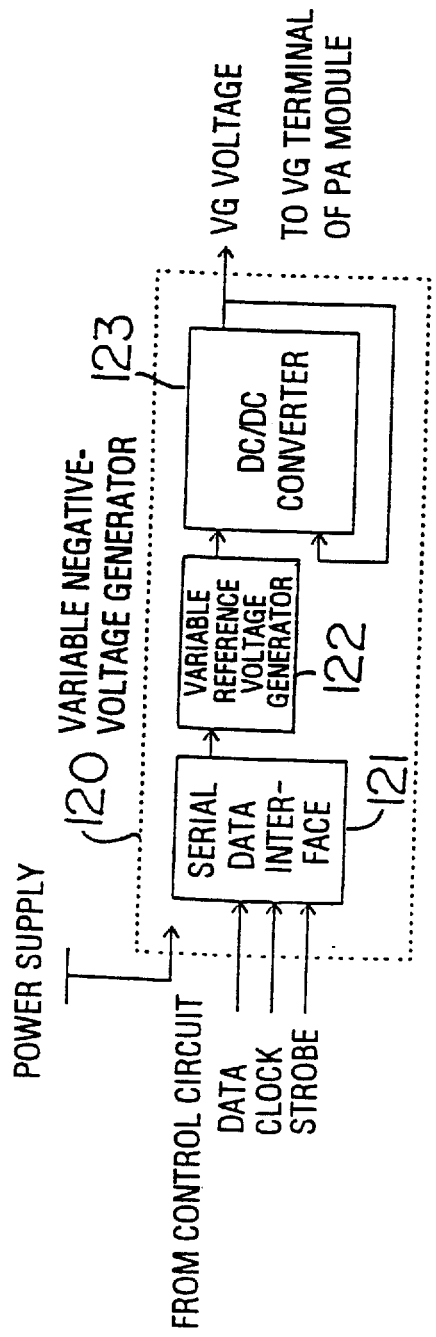
FIG. 7 is a block diagram showing an internal structure of a variable negative voltage generator.

FIG. 7 is a block diagram showing an internal structure of the variable negative voltage generator. A serial data interface 121 in the variable negative-voltage generator 120 has a serial data input for receiving gate voltage setting commands, a clock input for synchronous communications and a strobe input. The serial data interface 121 forwards the received data to a variable reference voltage generator 122.

The variable reference voltage generator 122 generates a reference voltage in proportional to the gate voltage setting command and it is inputted to a DC/DC converter 123. The DC/DC converter 123 outputs the gate voltage VG by converting the reference voltage. The gate voltage VG is provided to a gate voltage input of the PA module and also fed back to the DC/DC converter 123.

For example, assume that a gate voltage setting command to increase the absolute value of the gate voltage VG was issued to the variable negative-voltage generator 120 and the serial data interface 121 has received the command. The variable reference voltage generator 122 then changes the gate voltage setting command to a voltage signal and the DC/DC converter 123 generates a negative gate voltage VG whose absolute value is thereby higher than the standard gate voltage.

As such, the gate voltage VG is increased when the supply voltage is too high or the PA module is heated up. It results in decreasing the electric current in the PA module and any damage due to overheat of the PA module is thus prevented.

The following will explain a specific example of gate voltage setting in reference to variations of the supply voltage.

FIG. 8 illustrates a threshold setting table for storing the thresholds with respect to the supply voltage. This table is stored in the threshold storage buffer 211 shown in FIG. 5. The table contains five thresholds in total and those thresholds VGTH1 through VGTH5 are set to 4.5 V, 5.0 V, 5.5 V, 6.0 V, and 6.5 V, respectively. This means that the gate voltage VG will be changed as the supply voltage goes across those thresholds. Actually, the threshold values are stored in the table in a form of 8-bit binary data (i.e., $00_H$ to $FF_H$ in hexadecimal).

FIG. 9 shows a gate voltage setting table for setting the gate voltage with respect to the supply voltage. In this example, the table contains compensation values to be added to the standard gate voltage so as to obtain the absolute values of the gate voltage VG.

The compensation values ΔVG1 through ΔVG5 correspond to the ranges of the supply voltage $V_x$ classified by the thresholds. Those compensation values ΔVG1 through ΔVG5 are set to 0.05 V, 0.10 V, 0.15 V, 0.20 V, and 0.25 V, respectively.

Because the table holds not the absolute level but the compensation values, it is possible to use the same table for the case that the standard gate voltage was changed to adapt to a switched transmission power.

Figure 10:
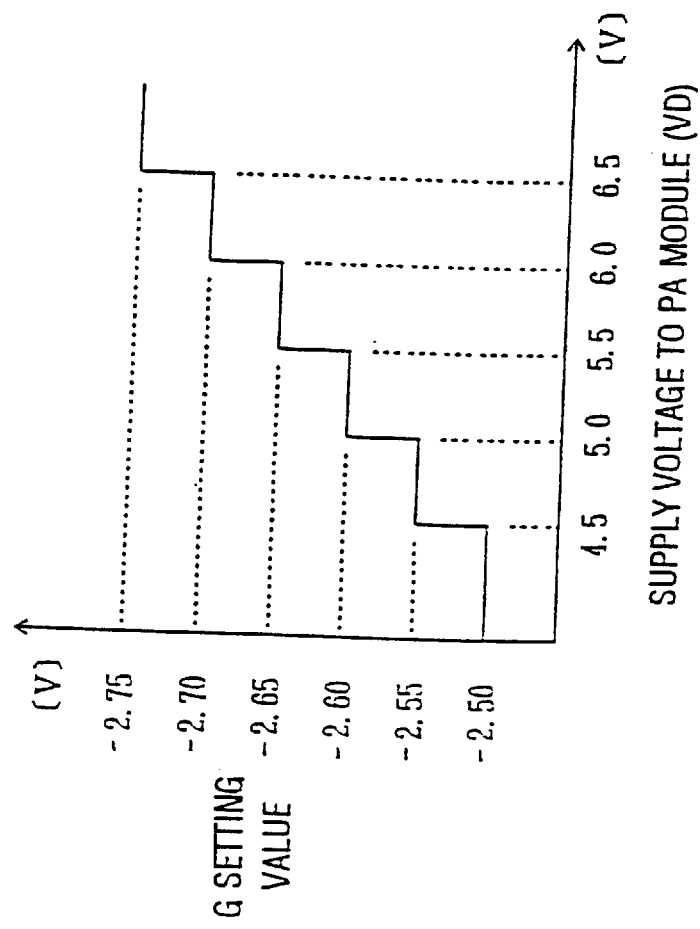
FIG. 10 shows a relation of a supply voltage for a PA module versus a gate voltage to be set thereto.

FIG. 10 plots a relation between the supply voltage for the PA module and the gate voltage to be set thereto. The horizontal axis of this graph shows the supply voltage VD of the PA module and the vertical axis is the gate voltage VG. Note that the supply voltage VD denotes the drain voltage and it is actually the same as the output voltage $V_x$ of the system power supply. The standard gate voltage is herein set to −2.5 V.

The graph indicates that the gate voltage VG keeps −2.50 V when the supply voltage VD is less than or equal to 4.5 V. When the VD exceeds 4.5 V but is not higher than 5.0 V, the VG steps down to −2.55 V. Similarly, at every 0.5 V step-up of the supply voltage VD, the gate voltage VG goes down by −0.05 V. For the VD higher than 6.5 V, the VG is clamped at −2.75 V.

That is, as the supply voltage increases, the absolute value of the gate voltage VG will also increase in a stepwise manner. The gate voltage has a negative potential and an increase of its absolute value results in a decrease of the drain current because of characteristics of the FET. Heat generation from the PA module will be thus suppressed.

FIG. 11 shows a threshold setting table for setting the thresholds with respect to the internal temperature. The table is stored in the threshold storage buffer 212 shown in FIG. 5. The table contains five thresholds in total and those thresholds VGTH1 through VGTH5 are set to 60° C., 70° C., 80° C., 90° C., and 100° C., respectively. The gate voltage VG will be varied each time the internal temperature goes across those thresholds. Actually, above threshold values are stored in the table in a form of 8-bit binary data (i.e., $00_H$ to $FF_H$ in hexadecimal).

FIG. 12 shows a gate voltage setting table for setting gate voltage with respect to the internal temperature. In this example, the table contains compensation values to be added to the standard gate voltage so as to obtain the absolute values of the gate voltage VG.

The compensation values ΔVG11 through ΔVG15 correspond to the ranges of the internal temperature $T_x$ classified by the thresholds. Those compensation values ΔVG11 through ΔVG15 are set to 0.05 V, 0.10 V, 0.15 V, 0.20 V, and 0.25 V, respectively.

As described above, as the internal temperature rises, the absolute value of the gate voltage VG will also increase in a stepwise manner. The gate voltage VG has a negative potential and an increase of its absolute value results in a decrease of the drain current because of characteristics of the FET. Heat generation from the PA module will be thus suppressed.

Figure 13:
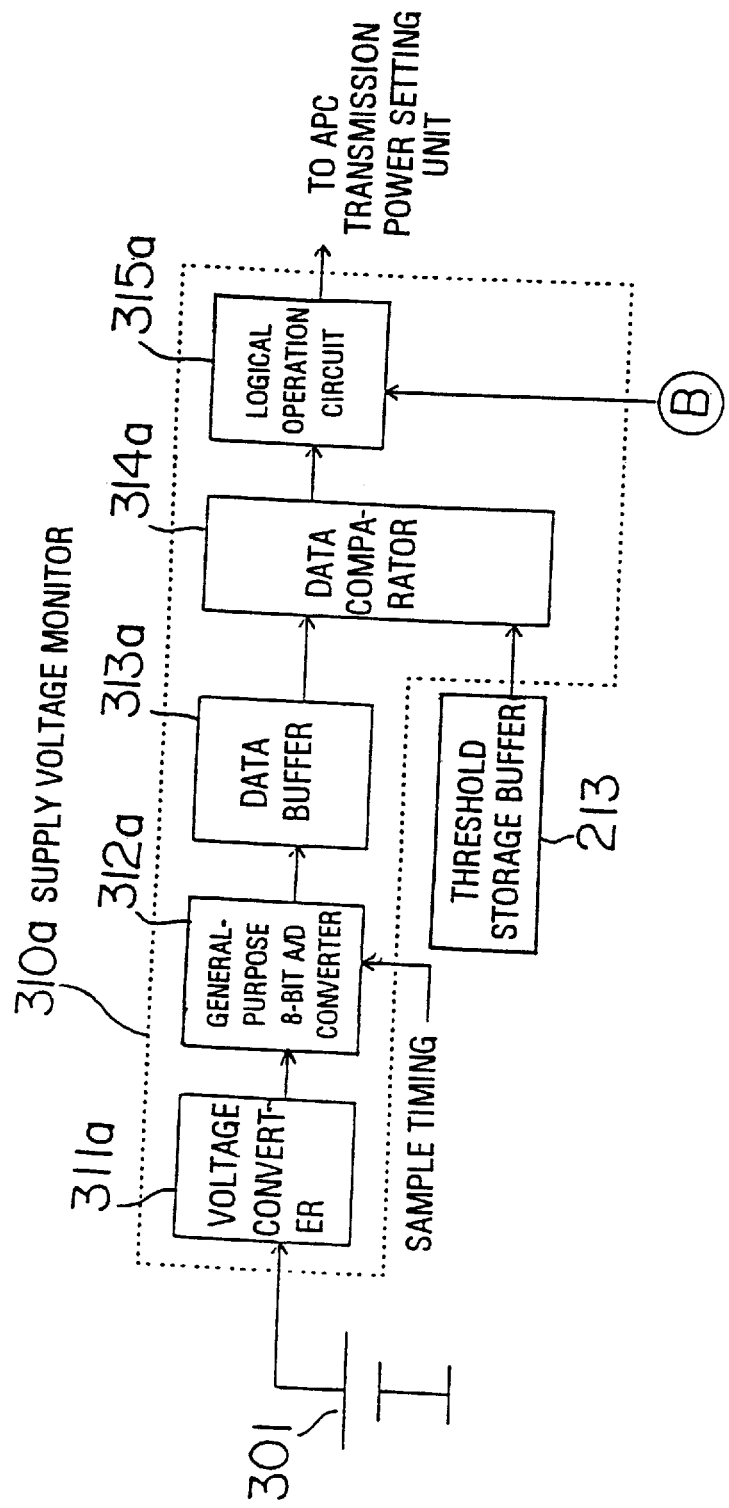
FIG. 13 is a block diagram showing an internal structure of a supply voltage monitor for controlling a transmission power.

FIG. 13 is a block diagram showing an internal structure of a supply voltage monitor for controlling a transmission power. A voltage converter 311a in a supply voltage monitor 310a reduces the voltage of a power supply 301 down to a low voltage suitable for measurement by an internal circuit. This reduced voltage is inputted to a general-purpose 8-bit A/D converter 312a.

A sample timing signal, which is generated in correspondence with transmission timings, triggers the A/D converter 312a to start conversion of its analog input voltage to digital data. The measured and converted supply voltage will be saved into a data buffer 313a as digital data.

A threshold storage buffer 213 stores a table of thresholds to be used for changing a transmission power setting command based upon the measured supply voltage. Those thresholds actually divide a total voltage range into a plurality of small ranges. A data comparator 314a compares the data in the data buffer 313a with the threshold values in the threshold storage buffer 213, and determines the voltage range which includes the measured supply voltage. The data comparator 314a then outputs a supply-associated power command corresponding to the voltage range determined by looking up in a transmission power setting table.

Note that supply-associated power commands for a supply voltage below a predetermined level will designate the same power as the standard transmission power. In other words, there is no need to compensate the transmission power as long as the supply voltage is within a normal range.

The supply-associated power command outputted from the data comparator 314a goes to a logical operation circuit 315a, which also receives a temperature-associated power command from the temperature monitor. From those two commands, the logical operation circuit 315a calculates a transmission power setting command to be finally supplied to the APC unit.

Figure 14:
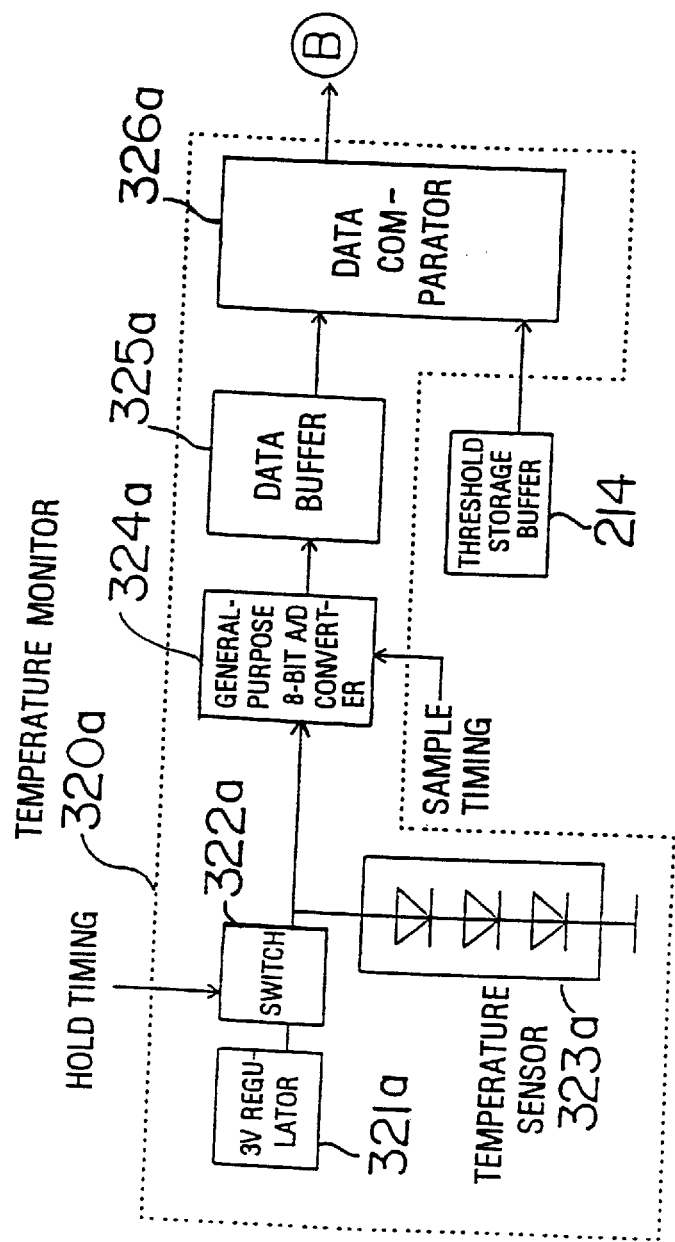
FIG. 14 is a block diagram showing an internal structure of a temperature monitor for controlling a transmission power.

FIG. 14 is a block diagram showing an internal structure of a temperature monitor specifically for controlling a transmission power. In a temperature monitor 320a, a 3 V regulator 321a supplies a current to a temperature sensor 323a via a switch 322a, and the temperature sensor 323a is wired to a general-purpose 8-bit A/D converter 324a. The switch 322a has a hold timing signal input which triggers temperature sensing operation. The temperature sensor 323a is organized by diodes connected in series allowing measurement of the internal temperature by sensing a change of their forward voltage drop, which is a function of junction temperature.

The general-purpose 8-bit A/D converter 324a is controlled by a sample timing signal input so that an analog temperature signal will be converted to digital data when the sample timing signal is activated. The digital temperature data obtained from the general-purpose 8-bit A/D converter 324a is then stored in a data buffer 325a.

A threshold storage buffer 214 stores a table of thresholds to be used for determining a transmission power in reference with the measured temperature. Those thresholds actually defines a plurality of temperature ranges. A data comparator 326a compares the data in the data buffer 325a with the threshold values in the threshold storage buffer 214, and determines the temperature range which includes the measured temperature. The data comparator 326a then outputs a temperature-associated power command corresponding to the temperature range determined above by looking up in a transmission power setting table.

Note that supply-associated power commands for a supply voltage below a predetermined level will designate the same power level as that for the standard transmission power. In other words, there is no need to compensate the transmission power setting as long as the supply voltage is within a normal range.

The temperature-associated power command outputted from the data comparator 326a goes to a logical operation circuit 315a shown in FIG. 13.

In the structure shown in FIGS. 13 and 14, the hold timing signal for the temperature monitor 320a is generated during the transmission timing of the portable telephone, thereby holding the temperature value to be measured. Consecutively generated is the sample timing signal, which is inputted to the general-purpose 8-bit A/D converter 312a in the supply voltage monitor 310a as well as to the general-purpose 8-bit A/D converter 324a in the temperature monitor 320a. The object of outputting the hold timing signal and the sample timing signal during the transmission time is to measure the supply voltage and internal temperature while the PA module is amplifying a transmission signal.

In the supply voltage monitor 310a of FIG. 13, the general-purpose 8-bit A/D converter 312a converts the supply voltage to an 8-bit digital data in response to the sample timing signal, and stores it into the data buffer 313a. The data comparator 314a compares the digital data of the supply voltage with the data in the threshold storage buffer 213 and thereby generates the supply-associated power command.

Similarly, in the temperature monitor 320a of FIG. 14, the general-purpose 8-bit A/D converter 324a converts the internal temperature to an 8-bit digital data in response to the sample timing signal, and stores it into the data buffer 325a. The data comparator 326a compares the digital data of the internal temperature with the data in the threshold storage buffer 214 and thereby generates the temperature-associated power command.

The generated supply-associated and temperature-associated power commands are analyzed in the logical operation circuit 315a shown in FIG. 13, and a transmission power setting command is synthesized for use in the APC unit. The logical operation taken in this procedure can be either an OR-type or AND-type logical negotiation.

In the case of taking an OR-type operation, the transmission power setting command is obtained so that it will compensate the standard transmission power, which is requested from a base station, with a sum of compensational factors involved in the supply-associated power command and the temperature-associated power command. The transmission power setting command thereby obtained will be sent to the APC unit. That is, if either the supply-associated or the temperature-associated power command is different from the standard transmission power setting, the different one will be the transmission power setting command. If both of them show different power levels from the standard transmission power, the sum of their differences will affect the transmission power setting command.

On the other hand, in the case of taking an AND-type operation, only when both of the two power commands are different from the standard transmission power, the transmission power setting command will be changed from the standard transmission power and sent to the APC unit. That is, the transmission power setting command is obtained so that it will compensate the standard transmission power with a sum of compensational factors involved in the supply-associated power command and the temperature-associated power command. If only one is different and the other is the same, the transmission power setting command will remain the same as the standard transmission power setting.

Regarding the data comparator 326a, it is possible to take other configurations. For example, the temperature-associated power command can be set as a multiplier to the supply-associated power command. That is, a transmission power setting command is calculated from the supply-associated power command multiplied by the temperature-associated power command. Another possible approach is that the supply-associated power command is defined as a multiplier to multiply the temperature-associated power command.

Figure 15:
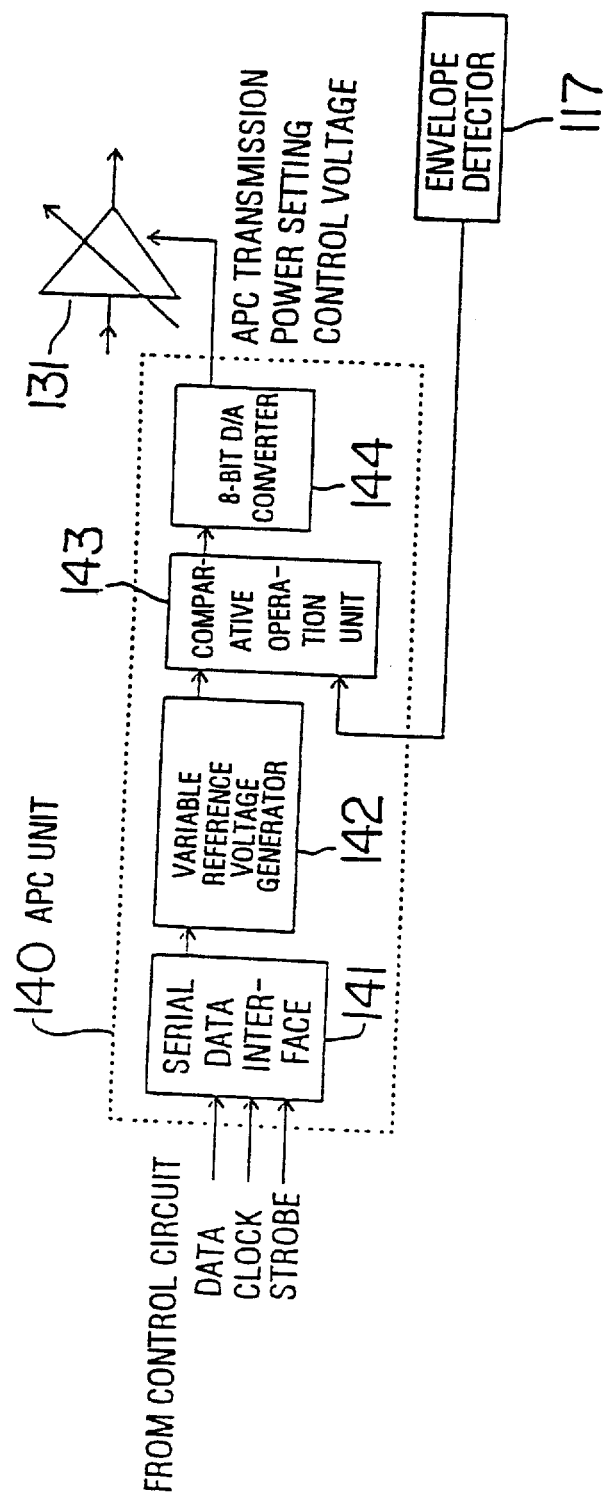
FIG. 15 is a block diagram showing an internal structure of an APC unit.

FIG. 15 is a block diagram showing an internal structure of an APC unit. A serial data interface 141 in the APC unit 140 has a serial data input for receiving transmission power setting commands, a clock input for synchronous communications and a strobe input. The serial data interface 141 forwards the received data to a variable reference voltage generator 142.

The variable reference voltage generator 142 generates a reference voltage in proportion to the transmission power setting command and it is inputted to a comparative operation unit 143. The comparative operation unit 143 has another input to receive a power level signal which is detected by an envelope detector 117 and indicates the current transmission power level. The comparative operation unit 143 compares those two signals and outputs digital data so as to control the transmission power level as commanded in the transmission power setting command. An 8-bit D/A converter 144 converts the digital data from the comparative operation unit 143 into an analog control voltage and sends it to a variable gain amplifier 131. The variable gain amplifier 131 amplifies the transmission signal with the gain specified in the analog control voltage.

Assume that a transmission power setting command to reduce the absolute value of the transmission power was issued to the APC unit 140 and the serial data interface 141 has received the command. The variable reference voltage generator 142 then changes the transmission power setting command to a voltage signal. The comparative operation unit 143 receives the command and outputs digital data to the 8-bit D/A converter 144 so that the transmission power level detected by the envelope detector 117 will be regulated to the commanded level. The 8-bit D/A converter 144 provides the variable gain amplifier 131 with an analog voltage converted from the digital data, thereby controlling the transmission power as set in the transmission power setting command.

As a result of above control, even if the supply voltage has dropped or the PA module is heated up, it is possible to continue communications keeping a stable transmission power by automatically shifting the power setting level to a lower level.

The following will explain a specific example of transmission power setting.

FIG. 16 shows a threshold setting table for setting the thresholds with respect to the supply voltage and internal temperature. This table contains one temperature threshold and three supply voltage thresholds. The supply voltage thresholds are actually stored in the threshold storage buffer 213 shown in FIG. 13 and the supply voltage threshold is stored in the threshold storage buffer 214 shown in FIG. 14.

TMPTH11, the threshold of the internal temperature, is set to 70° C. The supply voltage thresholds VDTH11, VDTH12 and VDTH13 are set to 3.4 V, 3.2 V, and 3.1 V, respectively. The transmission power setting level will be changed each time the supply voltage goes across those thresholds. Actually, those thresholds are stored in the table in the form of 8-bit binary data (i.e., $00_H$ to $FF_H$ in hexadecimal).

FIG. 17 shows a transmission power setting table for setting the transmission power. In this example, the table contains compensation values to be added to the standard transmission power and the absolute values of the transmission power is thereby obtained.

A temperature-associated power compensation ΔPWR (TMP) is set to 1.0 dB for temperature below the threshold TMPTH11. Supply-associated power compensations ΔPWR (VDTH11) through ΔPWR(VDTH13) are set to 0.5 dB, 1.0 dB, and 1.5 dB, respectively. The final temperature-associated power setting command, in this example, is calculated by adding those two compensation values. Consequently, the power can be reduced by 2.5 dB at the maximum.

Figure 18:
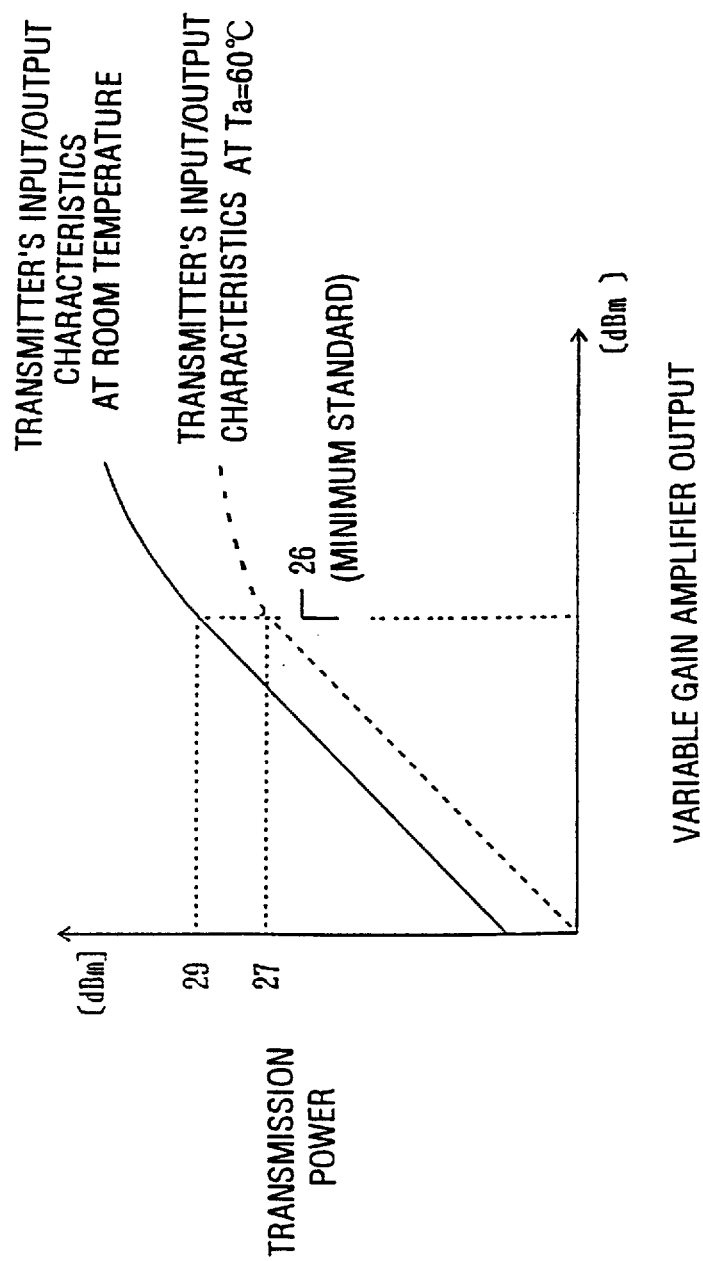
FIG. 18 plots a relation between an output power of a variable gain amplifier and a transmission power.
Figure 19:
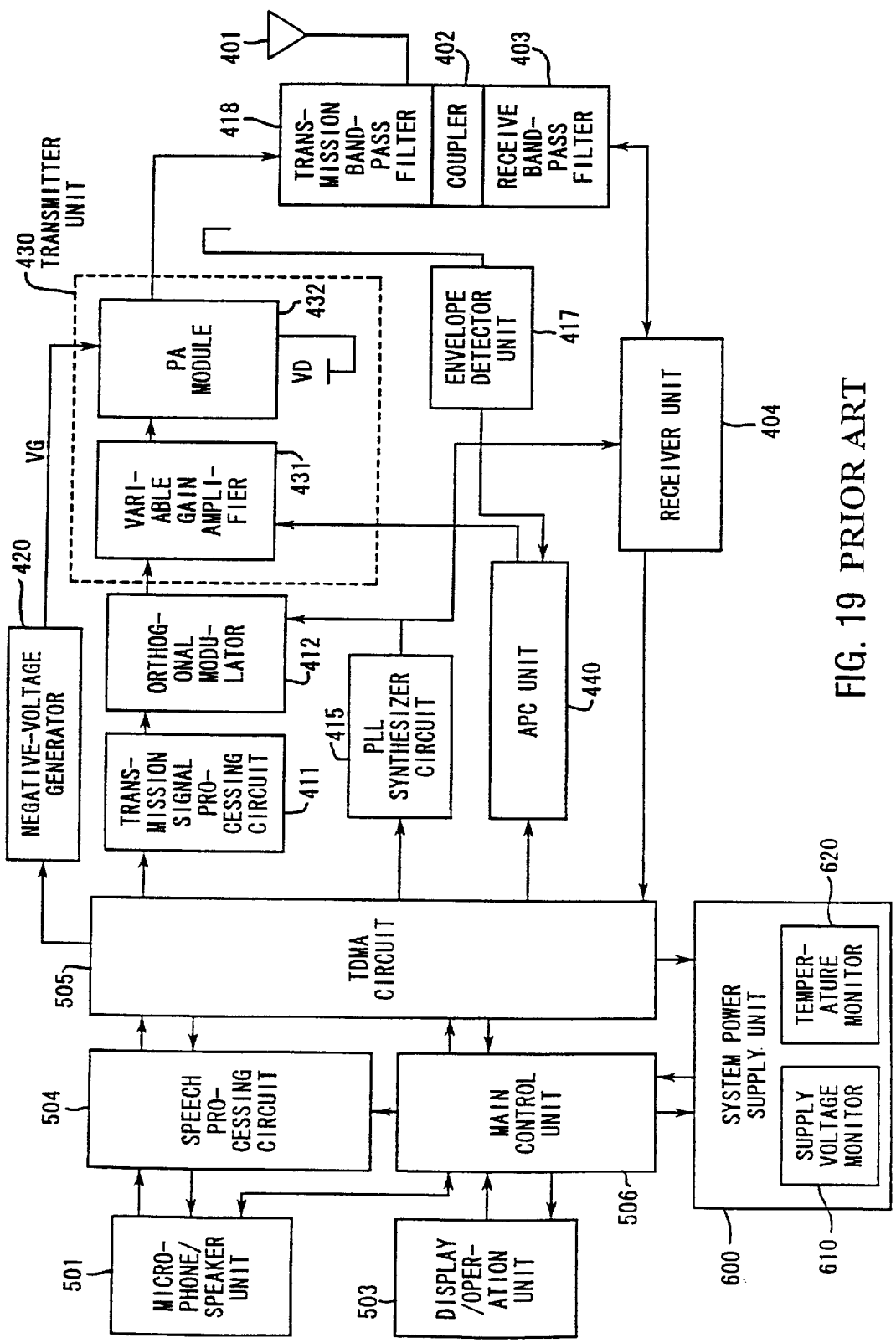
FIG. 19 is a block diagram schematically showing a structure of a conventional portable telephone.

FIG. 18 plots a relation between the output power of the variable gain amplifier and the transmission power. The horizontal axis of this graph shows the output power of the variable gain amplifier and the vertical axis shows the transmission power. The graph plots input-vs-output characteristics in two cases, one is at normal temperature (shown in a solid line) and the other is at 60° C. ambient temperature (shown in a broken line) . It is also assumed that the communications base station requests that the standard maximum transmission power be 29 dBm.

At a normal temperature, the transmission power of this portable telephone reaches 29 dBm in accordance with increase in the output power of the variable gain amplifier.

On the other hand, when the ambient temperature is 60° C., it may not be able to output 29 dBm even though the output of the variable gain amplifier is raised. If it was tried to transmit with a power of 29 dBm at the ambient temperature of 60° C., the transmission power would fluctuate due to various factors such as an external temperature.

Therefore, it is more reliable to operate with a lower but stable power setting of 27 dBm rather than to operate with a 29 dBm setting which may not work steadily.

Above explanation was of the case that the standard maximum transmission power was requested, however, the communications base station may request the portable telephone to transmit with other power settings. That is, it is allowed by the communications standard to take −4 dB stepwise levels. The present invention can also adapt to any other standard transmission power setting. Consequently, the portable telephone of the present invention is capable of keeping stable transmission outputs by automatically reducing its power setting under the condition that it is impossible to provide the power requested by the communications base station.

In addition to reducing the power setting in the case described above, it is also possible to increase the transmission power setting when it is allowed under such condition that the temperature is low or the supply voltage is high.

As described above, according to the present invention, the gate voltage of the power amplifier module is controlled with reference to the detected power supply voltage or internal temperature. By that means, when the temperature of the power amplifier module rises, the electric current in the module will be suppressed by increasing the absolute gate voltage. It results in avoiding a thermal defect of the power amplifier module.

In addition, the transmission power setting is decided with reference to the detected power supply voltage or internal temperature. The portable telephone is capable of keeping stable transmission outputs by automatically changing its power setting when it is unable to provide the requested power. As a result, a highly reliable operation will be maintained even in the condition that the portable telephone can not provide enough amplification capabilities.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A portable telephone including a power amplifier module to amplify a transmission signal, comprising:

supply voltage monitoring means for detecting a supply voltage of a power supply;

a control-voltage setting table for registering a plurality of commands which specify a control-voltage of the power amplifier module according to the supply voltage;

control-voltage selecting means for selecting a control-voltage setting command out of the control-voltage setting table, which is associated with the supply voltage detected by the supply voltage monitoring means; and control-voltage generating means for generating the control-voltage of the power amplifier module according to the control-voltage setting command selected by the control-voltage selecting means, wherein said control-voltage setting table contains the plurality of commands which specify, depending upon the supply voltage detected by said supply voltage monitoring means, lower transmission power settings than a standard transmission power setting under conditions that it is difficult to generate the transmission power more than the standard transmission power setting and higher transmission power settings than a standard transmission power setting under conditions that it is difficult to generate the transmission power less than the standard transmission power setting.

2. A portable telephone according to claim 1, wherein said control-voltage setting table contains the plurality of commands, which specify the gate voltage of the power amplifier module according to the supply voltage, being arranged in association with supply voltage ranges divided by thresholds.

3. A portable telephone including a power amplifier module to amplify a transmission signal, comprising:

internal temperature monitoring means for detecting an internal temperature;

a control-voltage setting table for registering a plurality of commands which specify a control-voltage of the power amplifier module according to the internal temperature;

control-voltage selecting means for selecting a control-voltage setting command out of the control-voltage setting table, which is associated with the internal temperature detected by the internal temperature monitoring means; and control-voltage generating means for generating the control-voltage of the power amplifier module according to the control-voltage setting command selected by the control-voltage selecting means, wherein said control-voltage setting table contains the plurality of commands which specify, depending upon the internal temperature detected by said internal temperature monitoring means, lower transmission power settings than a standard transmission power setting under conditions that it is difficult to generate the transmission power more than the standard transmission power setting and higher transmission power settings than a standard transmission power setting under conditions that it is difficult to generate the transmission power less than the standard transmission power setting.

4. A portable telephone according to claim 3, wherein said control-voltage setting table contains the plurality of commands, which specify the control-voltage of the power amplifier module according to the internal temperature, being arranged in association with temperature ranges divided by thresholds.

5. A portable telephone including a power amplifier module to amplify a transmission signal, comprising:

supply voltage monitoring means for detecting a supply voltage of a power supply;

a first control-voltage setting table for registering a plurality of control-voltage setting commands which specify a control-voltage of the power amplifier module according to the supply voltage;

first control-voltage selecting means for selecting a supply-associated command out of the first control-voltage setting table, which is associated with the supply voltage detected by the supply voltage monitoring means;

internal temperature monitoring means for detecting an internal temperature;

a second control-voltage setting table for registering a plurality of control-voltage setting commands which specify the control-voltage of the power amplifier module according to the internal temperature;

second control-voltage selecting means for selecting a temperature-associated command out of the second control-voltage setting table, which is associated with the internal temperature detected by the internal temperature monitoring means;

control-voltage calculation means for calculating a control-voltage setting command by logical and arithmetic operations of the supply-associated command and the temperature-associated command; and control-voltage generating means for generating the control-voltage of the power amplifier module according to the control-voltage setting command.

6. A portable telephone according to claim 5, wherein said control-voltage calculation means generates the control-voltage setting command which compensates a standard control-voltage setting with a sum of compensational factors involved in the supply-associated command and the temperature-associated command.

7. A portable telephone according to claim 5, wherein said control-voltage calculation means generates the control-voltage setting command which compensates a standard control-voltage setting with a sum of compensational factors involved in both the supply-associated command and the temperature-associated command, only when both the supply-associated command and the temperature-associated command contain the compensational factor.

8. A portable telephone according to claim 5, wherein said control-voltage calculation means generates the control-voltage setting command which compensates a standard control-voltage setting with a product of a compensational factor involved in the supply-associated command and the temperature-associated command as a multiplier.

9. A portable telephone according to claim 5, wherein said control-voltage calculation means generates the control-voltage setting command which compensates a standard control-voltage setting with a product of a compensational factor involved in the temperature-associated command and the supply-associated command as a multiplier.

10. A portable telephone according to claim 5, wherein said first control-voltage setting table contains the plurality of control-voltage setting commands, which specify the control-voltage of the power amplifier module according to the supply voltage, being arranged in association with supply voltage ranges divided by thresholds.

11. A portable telephone according to claim 5, wherein said second control-voltage setting table contains the plurality of control-voltage setting commands, which specify the control-voltage of the power amplifier module according to the internal temperature, being arranged in association with temperature ranges divided by thresholds.

12. A portable telephone capable of outputting transmission signals at an arbitrary power level, comprising:

supply voltage monitoring means for detecting a supply voltage of a power supply;

a transmission power setting table for registering a plurality of commands which specify a transmission power according to the supply voltage;

transmission power selecting means for selecting a transmission power setting command out of the transmission power setting table, which is associated with the supply voltage detected by the supply voltage monitoring means; and transmission power control means for controlling the transmission power according to the transmission power setting command selected by the transmission power selecting means, wherein said transmission power setting table contains the plurality of commands which specify lower transmission power settings than a standard transmission power setting under conditions that it is difficult to generate the transmission power more than the standard transmission power setting.

13. A portable telephone according to claim 12, wherein said transmission power control means controls the transmission power, being adaptive to each of standard transmission power settings which designate a plurality of power levels in a stepwise manner, according to the transmission power setting command selected by the transmission power selecting means.

14. A portable telephone capable of outputting transmission signals at an arbitrary power level, comprising:

supply voltage monitoring means for detecting a supply voltage of a power supply;

a transmission power setting table for registering a plurality of commands which specify a transmission power according to the supply voltage;

transmission power selecting means for selecting a transmission power setting command out of the transmission power setting table, which is associated with the supply voltage detected by the supply voltage monitoring means; and transmission power control means for controlling the transmission power according to the transmission power setting command selected by the transmission power selecting means, wherein said transmission power setting table contains the plurality of commands which specify higher transmission power settings than a standard transmission power setting under conditions that it is difficult to generate the transmission power less than the standard transmission power setting.

15. A portable telephone according to claim 14, wherein said transmission power control means controls the transmission power, being adaptive to each of standard transmission power settings which designate a plurality of power levels in a stepwise manner, according to the transmission power selecting means.

16. A portable telephone capable of outputting transmission signals at an arbitrary power level, comprising:

internal temperature monitoring means for detecting an internal temperature;

a transmission power setting table for registering a plurality of commands which specify a transmission power according to the internal temperature;

transmission power selecting means for selecting a transmission power setting command out of the transmission power setting table, which is associated with the internal temperature detected by the internal temperature monitoring means; and transmission power control means for controlling the transmission power according to the transmission power setting command selected by the transmission power selecting means, wherein said transmission power setting table contains the plurality of commands which specify lower transmission power settings than a standard transmission power setting, under conditions that it is difficult to generate the transmission power more than the standard transmission power setting.

17. A portable telephone capable of outputting transmission signals at an arbitrary power level, comprising:

internal temperature monitoring means for detecting an internal temperature;

a transmission power setting table for registering a plurality of commands which specify a transmission power according to the internal temperature;

transmission power selecting means for selecting a transmission power setting command out of the transmission power setting table, which is associated with the internal temperature detected by the internal temperature monitoring means; and transmission power control means for controlling the transmission power according to the transmission power setting command selected by the transmission power selecting means, wherein said transmission power setting table contains the plurality of commands which specify higher transmission power settings than a standard transmission power setting, under conditions that it is difficult to generate the transmission power less than the standard transmission power setting.

18. A portable telephone capable of outputting transmission signals at an arbitrary power level, comprising:

supply voltage monitoring means for detecting a supply voltage of a power supply;

a first transmission power setting table for registering a plurality of commands which specify a transmission power according to the supply voltage;

first transmission power selecting means for selecting a supply-associated command out of the first transmission power setting table, which is associated with the supply voltage detected by the supply voltage monitoring means;

internal temperature monitoring means for detecting an internal temperature;

a second transmission power setting table for registering a plurality of commands which specify a transmission power according to the internal temperature;

second transmission power selecting means for selecting a temperature-associated command out of the second transmission power setting table, which is associated with the internal temperature detected by the internal temperature monitoring means;

transmission power calculation means for calculating a transmission power setting command by logical and arithmetic operations of the supply-associated command and the temperature-associated command; and transmission power control means for controlling the transmission power according to the transmission power setting command.

19. A portable telephone according to claim 18, wherein said transmission power calculation means generates the transmission power setting command which compensates a standard transmission power setting with a sum of compensational factors involved in the supply-associated command and the temperature-associated command.

20. A portable telephone according to claim 18, wherein said transmission power calculation means generates the transmission power setting command which compensates a standard transmission power setting with a sum of compensational factors involved in both the supply-associated command and the temperature-associated command, only when both the supply-associated command and the temperature-associated command contain the compensational factors.

21. A portable telephone according to claim 18, wherein said transmission power calculation means generates a transmission power setting command which compensates a standard transmission power setting with a product of a compensational factor involved in the supply-associated command and the temperature-associated command as a multiplier.

22. A portable telephone according to claim 18, wherein said transmission power calculation means generates a transmission power setting command which compensates a standard transmission power setting with a product of a compensational factor involved in the temperature-associated command and the supply-associated command as a multiplier.

23. A portable telephone according to claim 18, wherein said transmission power setting table contains the plurality of commands, which specify the transmission power according to the supply voltage, being arranged in association with supply voltage ranges divided by thresholds.

24. A portable telephone according to claim 18, wherein said transmission power setting table contains the plurality of commands, which specify the transmission power according to the internal temperature, being arranged in association with temperature ranges divided by thresholds.

* * * * *